(12) United States Patent
Chan et al.

(10) Patent No.: US 7,872,303 B2
(45) Date of Patent: *Jan. 18, 2011

(54) FINFET WITH LONGITUDINAL STRESS IN A CHANNEL

(75) Inventors: Kevin K. Chan, Staten Island, NY (US); Qiqing Christine Ouyang, Yorktown Heights, NY (US); Dae-Gyu Park, Poughquag, NY (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

This patent is subject to a terminal disclaimer.

(21) Appl. No.: 12/191,425

(22) Filed: Aug. 14, 2008

(65) Prior Publication Data
US 2010/0038679 A1   Feb. 18, 2010

(51) Int. Cl.
*H01L 21/00* (2006.01)

(52) U.S. Cl. .................. 257/329; 257/332; 257/369; 257/619; 257/E21.403; 257/E21.632; 257/E27.067; 257/E29.056; 257/E29.246; 257/E29.275

(58) Field of Classification Search .................. 257/192, 257/329–332, 366–369, 619–623, E21.403, 257/632, E27.067, E29.056, E29.275, 137, 257/246–275, E39.011
See application file for complete search history.

(56) References Cited

U.S. PATENT DOCUMENTS

| | | | | |
|---|---|---|---|---|
| 6,475,869 B1 * | 11/2002 | Yu | ............................. | 438/303 |
| 6,525,403 B2 * | 2/2003 | Inaba et al. | .................. | 257/329 |
| 6,756,277 B1 * | 6/2004 | Yu | ............................. | 438/300 |
| 6,812,075 B2 * | 11/2004 | Fried et al. | .................. | 438/157 |
| 6,846,734 B2 * | 1/2005 | Amos et al. | .................. | 438/592 |
| 6,885,055 B2 * | 4/2005 | Lee | ............................. | 257/308 |
| 7,138,302 B2 * | 11/2006 | Xiang et al. | ................. | 438/142 |
| 7,202,117 B2 * | 4/2007 | Orlowski | ..................... | 438/149 |
| 7,202,494 B2 * | 4/2007 | Blanchard et al. | ............... | 257/9 |
| 7,297,600 B2 * | 11/2007 | Oh et al. | ..................... | 438/283 |
| 7,300,837 B2 * | 11/2007 | Chen et al. | ................... | 438/213 |
| 7,485,520 B2 * | 2/2009 | Zhu et al. | .................... | 438/197 |
| 7,485,536 B2 * | 2/2009 | Jin et al. | ..................... | 438/305 |
| 2006/0292765 A1 * | 12/2006 | Blanchard et al. | ........... | 438/157 |
| 2008/0111195 A1 * | 5/2008 | Atanackovic | ............... | 257/366 |
| 2009/0294800 A1 * | 12/2009 | Cheng et al. | ................. | 257/192 |
| 2010/0065917 A1 * | 3/2010 | Ohta et al. | ................... | 257/369 |

* cited by examiner

*Primary Examiner*—Michael S Lebentritt
(74) *Attorney, Agent, or Firm*—Scully, Scott, Murphy & Presser, P.C.; H. Daniel Schnurmann

(57) ABSTRACT

At least one gate dielectric, a gate electrode, and a gate cap dielectric are formed over at least one channel region of at least one semiconductor fin. A gate spacer is formed on the sidewalls of the gate electrode, exposing end portions of the fin on both sides of the gate electrode. The exposed portions of the semiconductor fin are vertically and laterally etched, thereby reducing the height and width of the at least one semiconductor fin in the end portions. Exposed portions of the insulator layer may also be recessed. A lattice-mismatched semiconductor material is grown on the remaining end portions of the at least one semiconductor fin by selective epitaxy with epitaxial registry with the at least one semiconductor fin. The lattice-mismatched material applies longitudinal stress along the channel of the finFET formed on the at least one semiconductor fin.

14 Claims, 10 Drawing Sheets

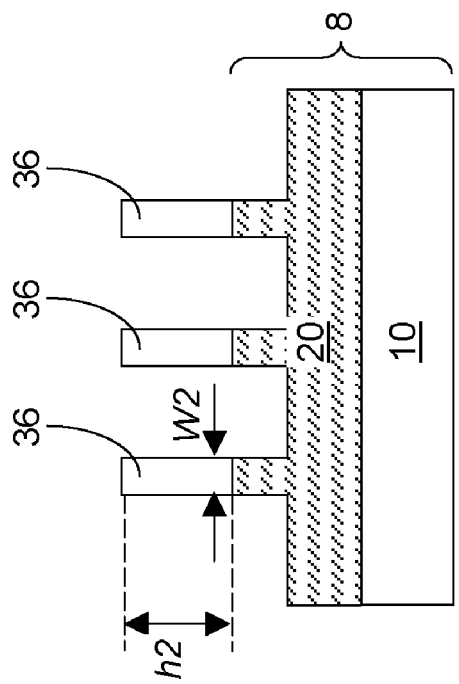
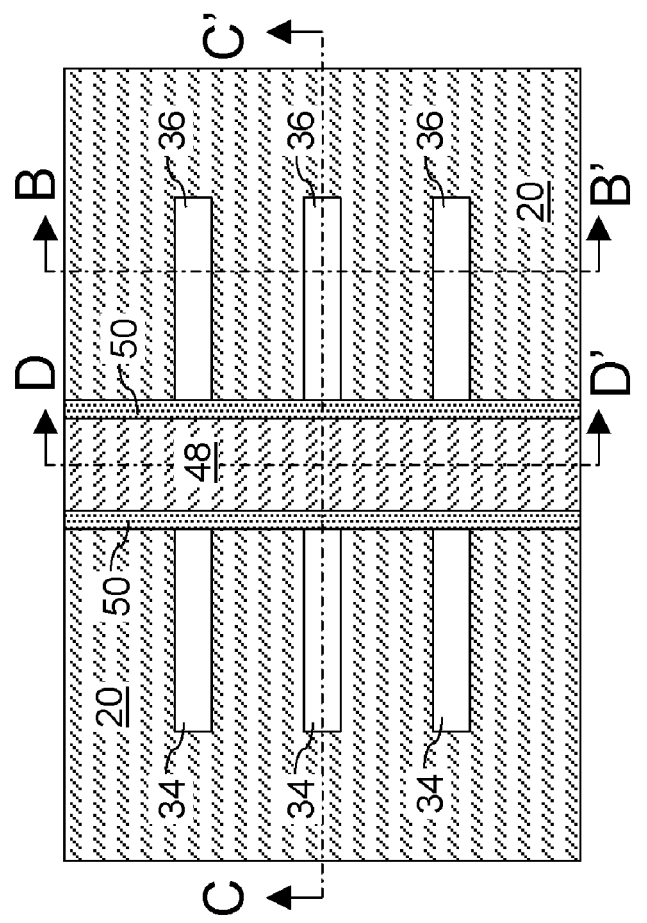
FIG. 4B
FIG. 4A

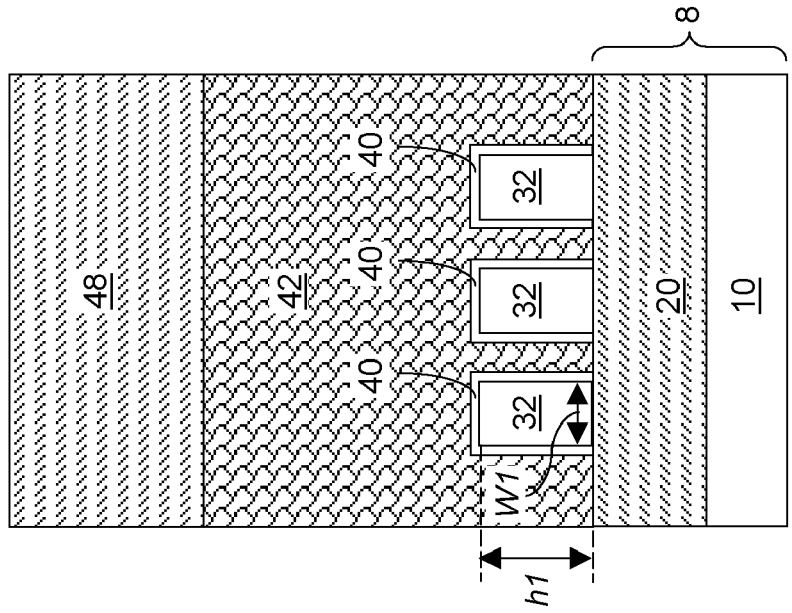
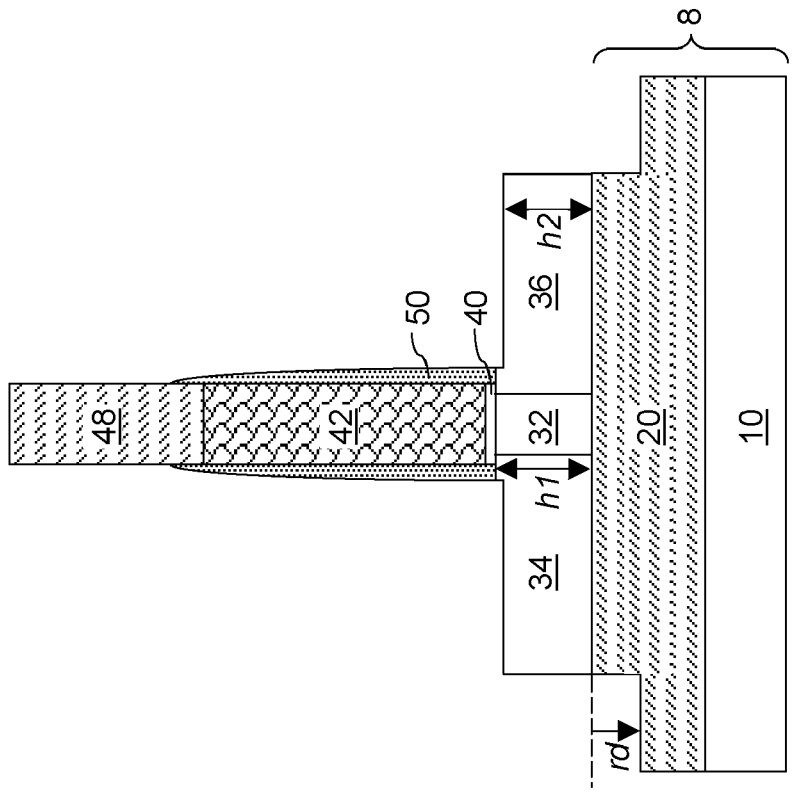
FIG. 4C
FIG. 4D

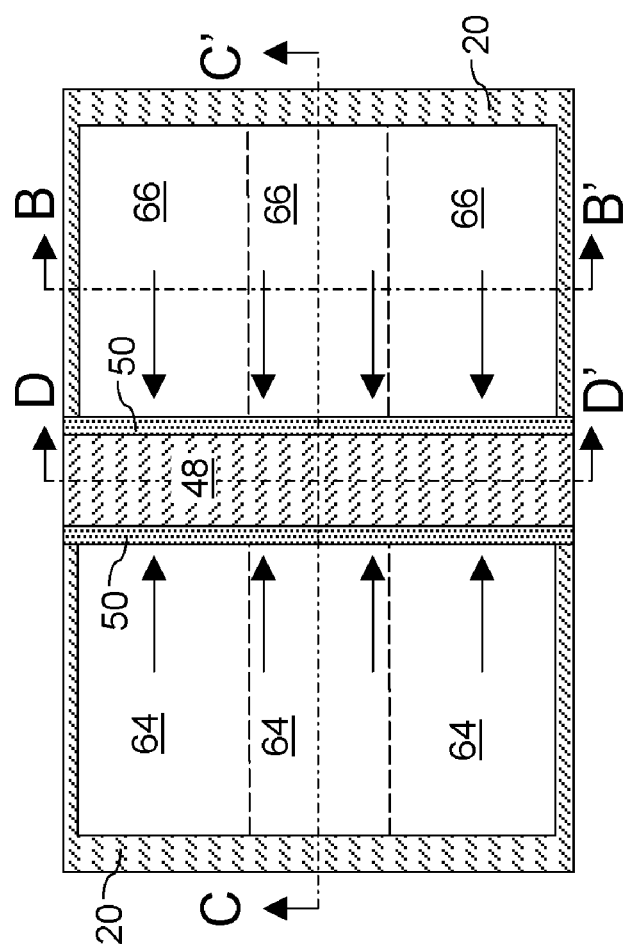
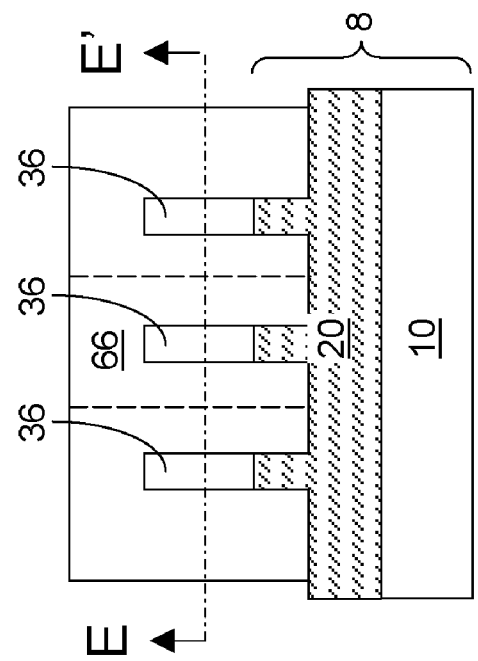
FIG. 5A
FIG. 5B

FINFET WITH LONGITUDINAL STRESS IN A CHANNEL

FIELD OF THE INVENTION

The present invention relates to a semiconductor device, and particularly, to a fin field effect transistor (finFET) having a longitudinal stress in a channel, and methods of manufacturing the same.

BACKGROUND OF THE INVENTION

A fin metal-oxide-semiconductor field effect transistor (FinMOSFET, or finFET) provides solutions to metal-oxide-semiconductor field effect transistor (MOSFET) scaling problems at, and below, the 45 nm node of semiconductor technology. A finFET comprises at least one narrow (preferably <30 nm wide) semiconductor fin gated on at least two opposing sides of each of the at least one semiconductor fin. Prior art finFET structures are typically formed on a semiconductor-on-insulator (SOI) substrate, because of low source/drain diffusion to substrate capacitance and ease of electrical isolation by shallow trench isolation structures.

A feature of a finFET is a gate electrode located on at least two sides of the channel of the transistor. Due to the advantageous feature of full depletion in a finFET, the increased number of sides on which the gate electrode controls the channel of the finFET enhances the controllability of the channel in a finFET compared to a planar MOSFET. The improved control of the channel allows smaller device dimensions with less short channel effects as well as larger electrical current that can be switched at high speeds. A finFET device has faster switching times, equivalent or higher current density, and much improved short channel control than the mainstream CMOS technology utilizing similar critical dimensions.

In a typical finFET structure, at least one horizontal channel on a vertical sidewall is provided within the semiconductor "fin" that is set sideways, or edgewise, upon a substrate. Typically, the fin comprises a single crystalline semiconductor material with a substantially rectangular cross-sectional area. Also typically, the height of the fin is greater than width of the fin to enable higher on-current per unit area of semiconductor area used for the finFET structure. In order to obtain desirable control of short channel effects (SCEs), the semiconductor fin is thin enough in a device channel region to ensure forming fully depleted semiconductor devices. Typically, the thickness, or the horizontal width, of a fin in a finFET is less than two-thirds of its gate length in order to obtain good control of the short channel effect.

One of the challenges for a finFET is the difficulty of introducing stress into the channel to enhance the mobility of charge carriers. Formation of an embedded stress-generating structure in a fin is difficult the fin typically protrudes above an insulator surface and does not have lateral support. Formation of a stress generating liner over a fin generates stress in the widthwise direction of the fin, but is not effective in generating stress in lengthwise direction. However, charge carrier mobility is improved for longitudinal stress for many crystallographic orientations of semiconductor materials.

In view of the above, there exists a need to provide a fin field effect transistor providing substantial longitudinal stress, i.e., stress along the direction of current flow, for enhancing device performance, and methods of manufacturing the same.

SUMMARY OF THE INVENTION

The present invention provides a fin field effect transistors (finFET) having longitudinal stress, which may be advantageously employed to enhance the device performance, and methods of manufacturing the same.

According to the present invention, at least one semiconductor fin is formed on an insulator layer. At least one gate dielectric, a gate electrode, and a gate cap dielectric are formed over at least one channel region of the at least one semiconductor fin. A gate spacer is formed on the sidewalls of the gate electrode, exposing end portions of the fin on both sides of the gate electrode. The exposed portions of the semiconductor fin are vertically and laterally etched, thereby reducing the height and width of the at least one semiconductor fin in the end portions. Exposed portions of the insulator layer may also be recessed. A lattice-mismatched semiconductor material is grown on the remaining end portions of the at least one semiconductor fin by selective epitaxy with epitaxial registry with the at least one semiconductor fin. The lattice-mismatched material applies longitudinal stress along the channel of the finFET formed on the at least one semiconductor fin, which is employed to enhance performance of the finFET.

According to an aspect of the present invention, a semiconductor structure is provided, which comprises:

a semiconductor fin comprising a first single crystalline semiconductor material having a first lattice constant and including a body region having a doping of a first conductivity type and a source region and a drain region having a doping of a second conductivity type, wherein said second conductivity type is the opposite of said first conductivity type;

a source-side epitaxial semiconductor region comprising a second single crystalline semiconductor material having a second lattice constant and epitaxially aligned to said source region, wherein said second lattice constant is different from said first lattice constant; and a drain-side epitaxial semiconductor region comprising said second single crystalline semiconductor material having said second lattice constant and epitaxially aligned to said drain region.

According to another aspect of the present invention, another semiconductor structure is provided, which comprises:

a plurality of semiconductor fins, each comprising a first single crystalline semiconductor material having a first lattice constant and including a body region having a doping of a first conductivity type and a source region and a drain region having a doping of a second conductivity type, wherein said second conductivity type is the opposite of said first conductivity type;

a plurality of laterally abutting source-side epitaxial semiconductor regions, each comprising a second single crystalline semiconductor material having a second lattice constant and epitaxially aligned to said source region, wherein said second lattice constant is different from said first lattice constant; and a plurality of laterally abutting drain-side epitaxial semiconductor regions, each comprising said second single crystalline semiconductor material having said second lattice constant and epitaxially aligned to said drain region.

According to yet another aspect of the present invention, a method of forming a semiconductor structure is provided, which comprises:

forming a semiconductor fin comprising a first single crystalline semiconductor material having a first lattice constant and having a shape of a rectangular parallelepiped on an insulator layer;

forming a gate dielectric and a gate electrode over a portion of said semiconductor fin;

etching a first end portion and a second end portion of said semiconductor fin, while maintaining unchanged a width and a height of a center portion of said semiconductor fin which laterally abuts said first end portion and said second end portion;

epitaxially growing a source-side epitaxial semiconductor region comprising a second single crystalline semiconductor material having a second lattice constant directly on said first end portion, wherein second lattice constant is different from said first lattice constant; and epitaxially growing a drain-side epitaxial semiconductor region comprising said second single crystalline semiconductor material directly on said second end portion.

BRIEF DESCRIPTION OF THE DRAWINGS

FIGS. 1A-1C, 2A-2D, 3A-3D, 4A-4D, 5A-5E are various sequential views of an exemplary semiconductor structure according to the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D', respectively, of the corresponding figure with the same numeric label and the suffix "A." FIG. 5E is a horizontal cross-sectional view along the plane E-E' in FIGS. 5B, 5C, and 5D.

FIGS. 1A, 1B, and 1C correspond to a step after formation of semiconductor fins 30 and gate dielectric layers 40L.

FIGS. 2A, 2B, 2C, and 2D correspond to a step after formation of a gate electrode 42 and a gate cap dielectric 48.

FIGS. 3A, 3B, 3C, and 3D correspond to a step after formation of gate dielectrics 40 and a gate spacer 50.

FIGS. 4A, 4B, 4C, and 4D correspond to a step after lateral and vertical etching of end portions of the semiconductor fin and vertical recessing of an insulator layer 20.

FIGS. 5A, 5B, 5C, 5D, and 5E correspond to a step after epitaxial growth of a source-side epitaxial semiconductor region 64 and a drain-side epitaxial semiconductor region 66.

DETAILED DESCRIPTION OF THE INVENTION

Figure 1B:
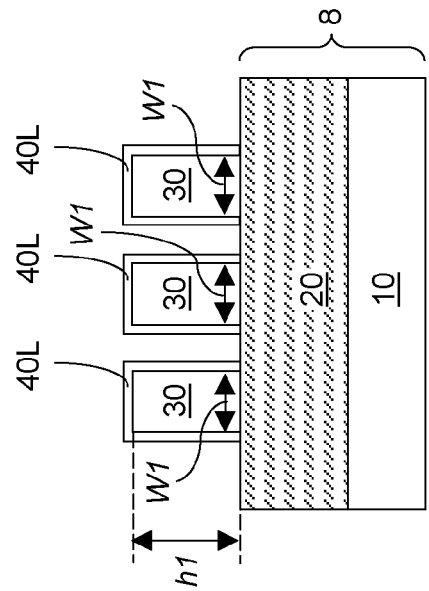

As stated above, the present invention relates to a fin field effect transistor (finFET) having a longitudinal stress in a channel, and methods of manufacturing the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 1A:
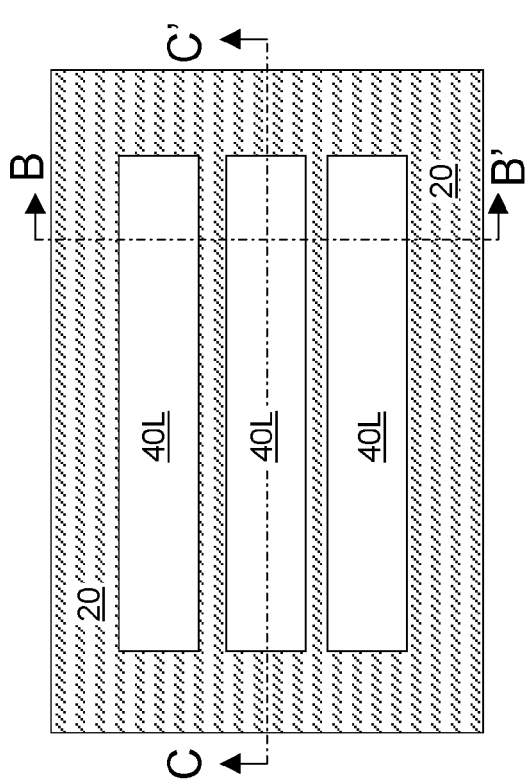
Figure 1C:
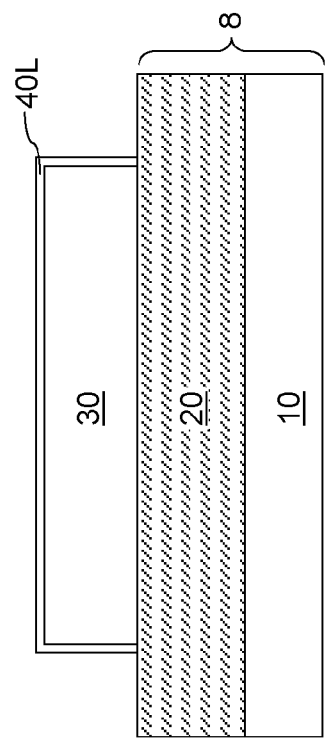
Figure 2B:
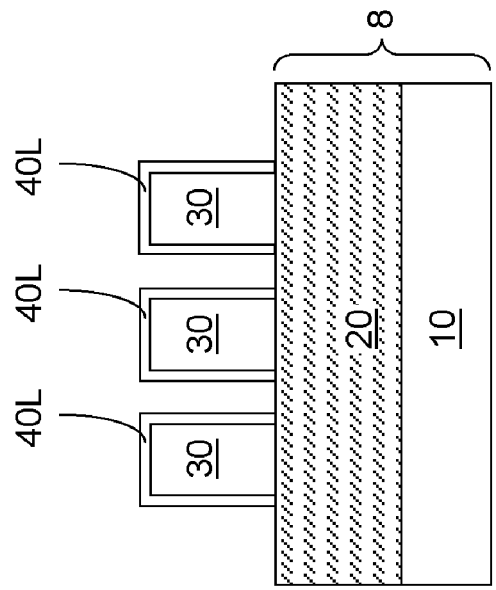
Figure 2A:
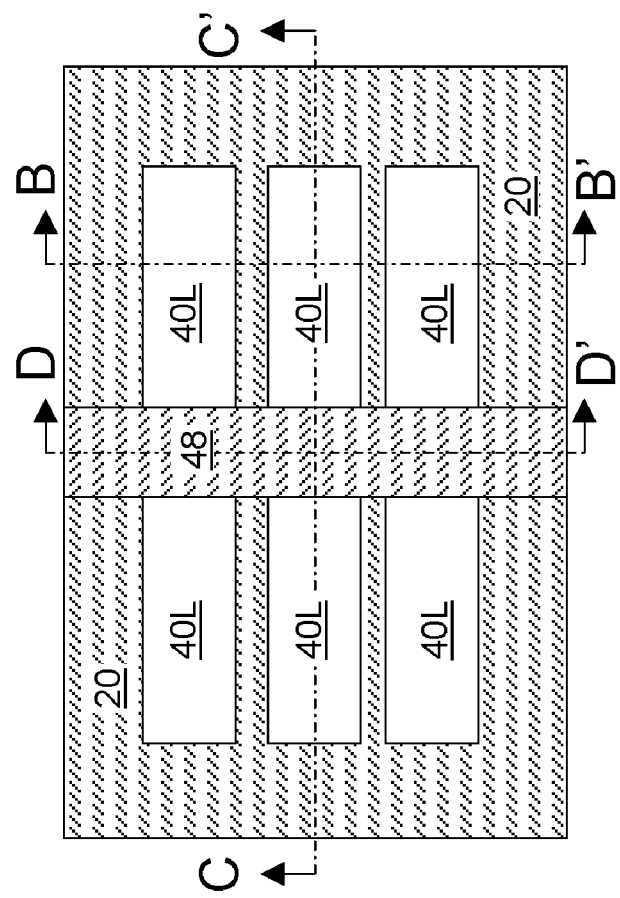
Figure 2C:
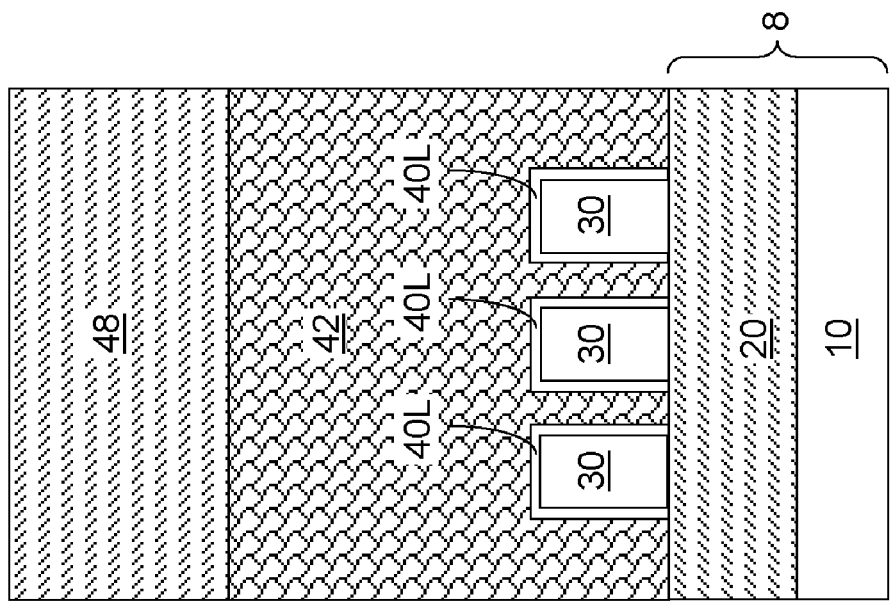
Figure 2D:
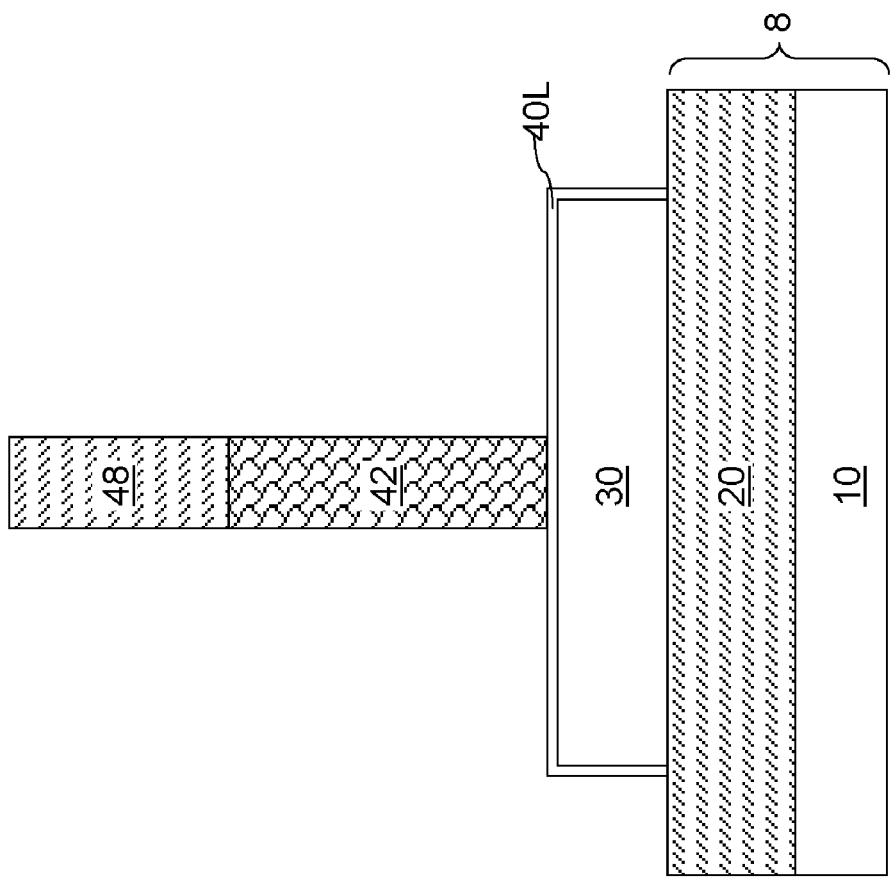
Figure 3A:
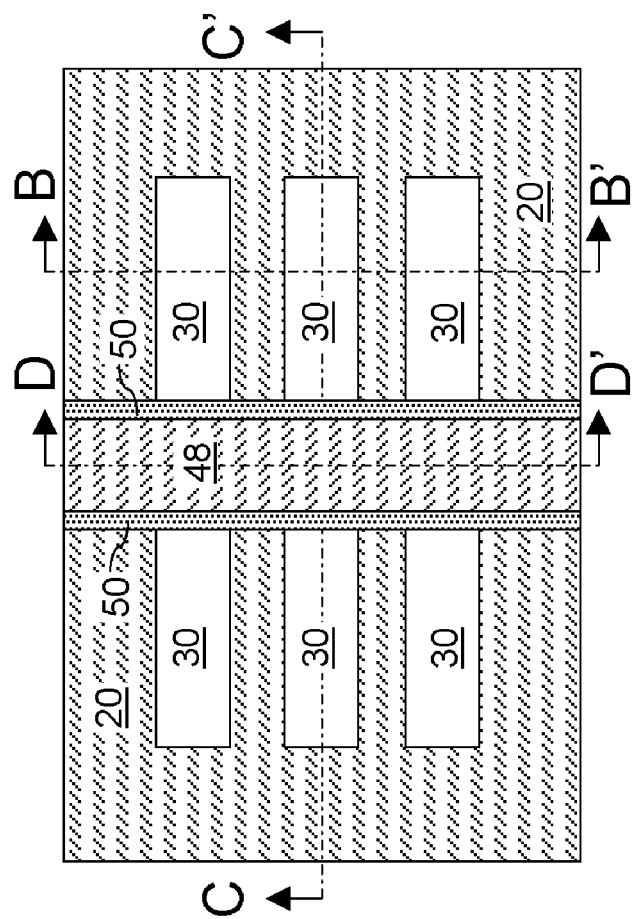
Figure 3B:
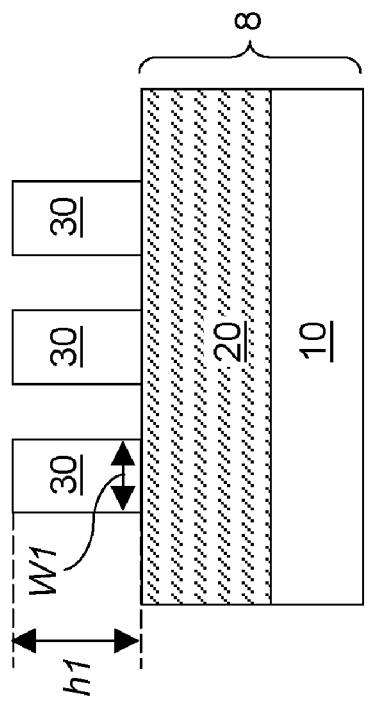
Figure 3D:
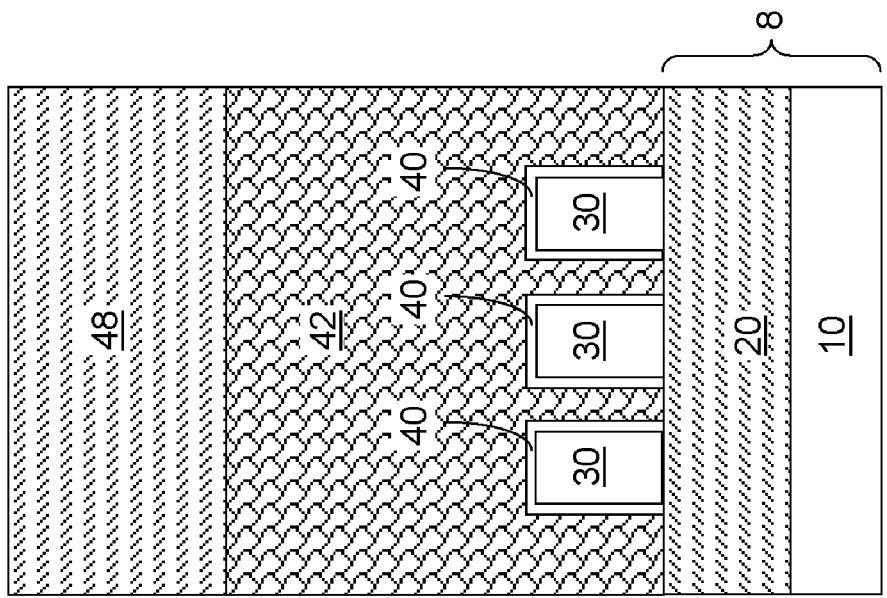
Figure 3C:
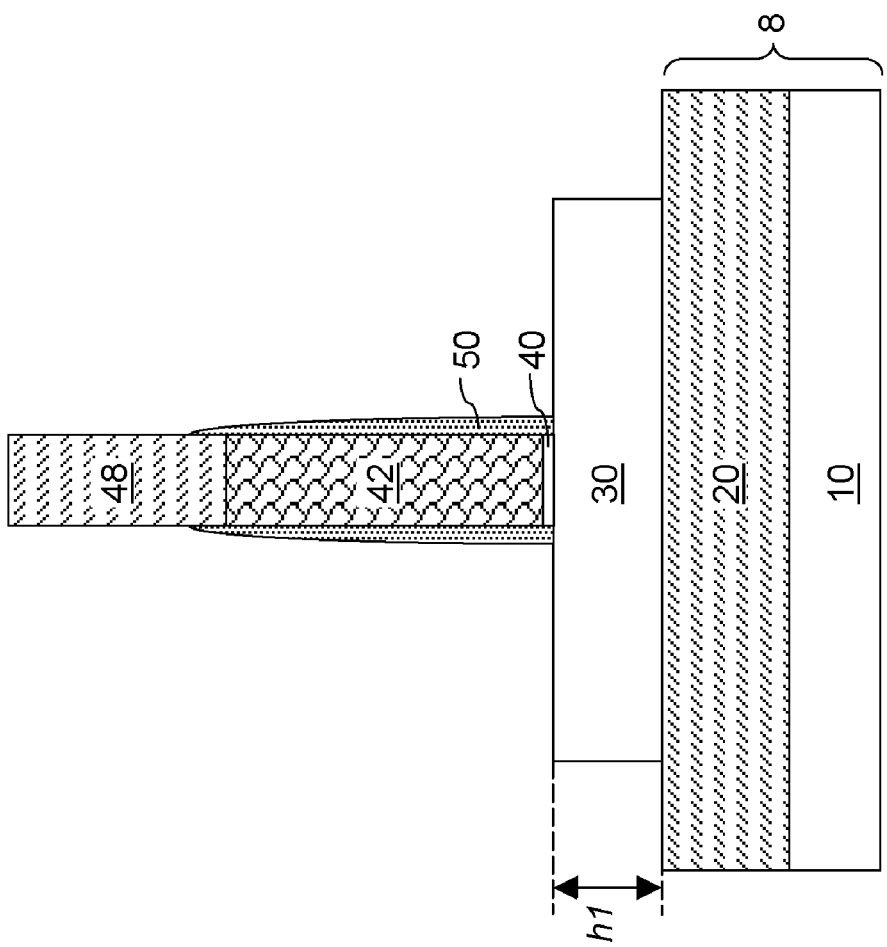
Figure 5D:
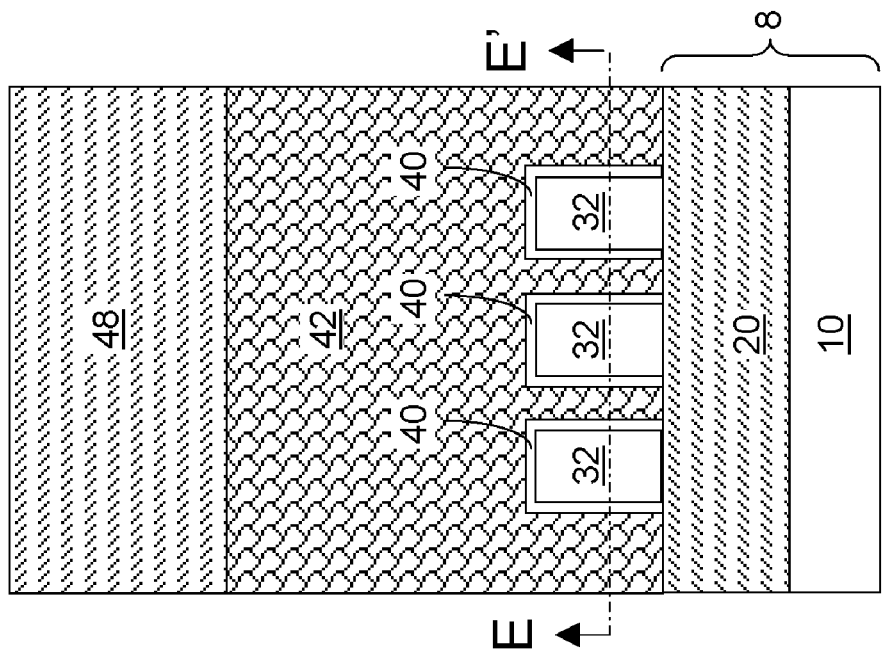
Figure 5C:
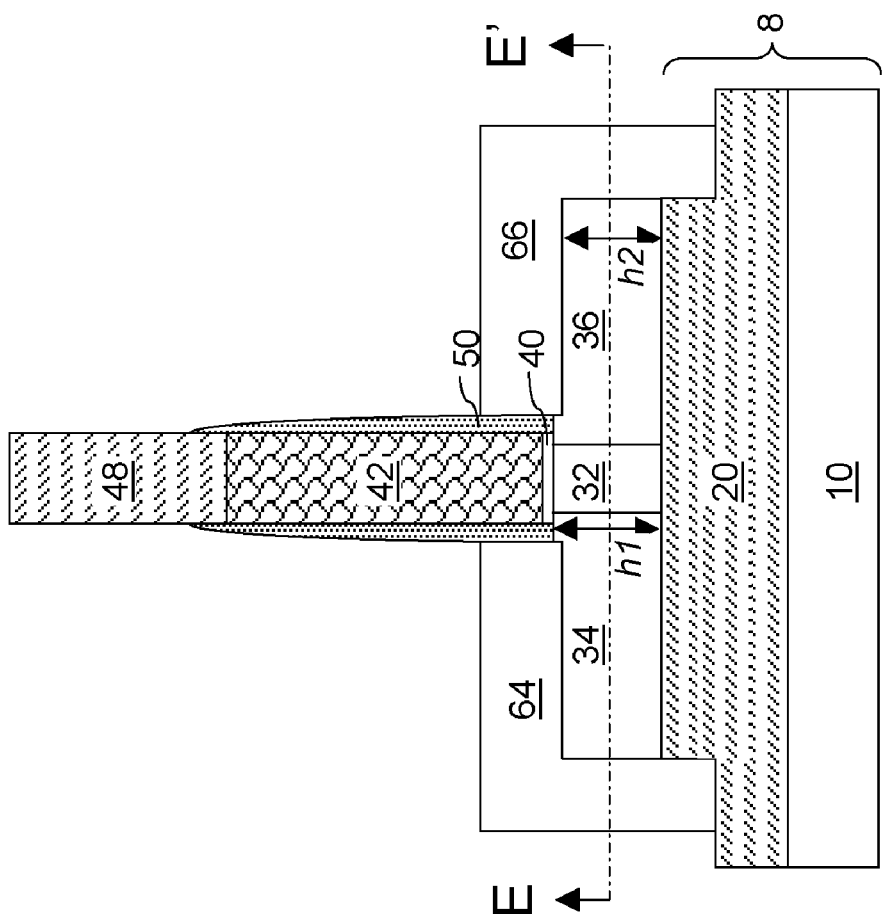
Figure 5E:
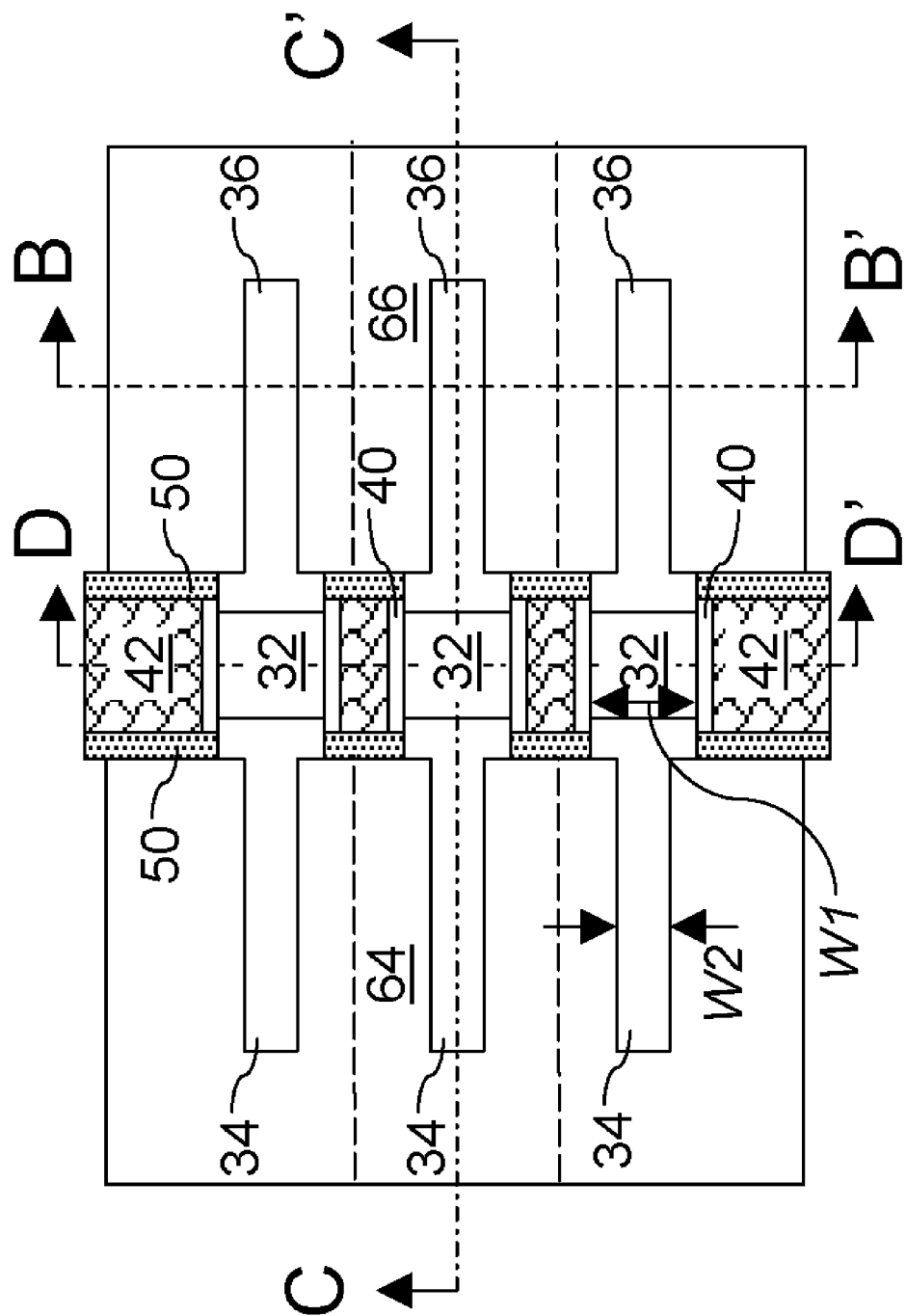

Referring to FIGS. 1A-1C, an exemplary semiconductor structure according to the present invention comprises a substrate 8 containing a handle substrate layer 10 and an insulator layer 20. The handle substrate layer 10 may comprise a semiconductor material, an insulator material, or a metallic material, and provides mechanical support for the insulator layer 20 and structures thereupon. Typically, the handle substrate 10 comprises a semiconductor material, which may be single crystalline, polycrystalline, or amorphous. The insulator layer 20 comprises an insulator material such as silicon oxide, silicon nitride, sapphire, etc.

Semiconductor fins 30 are provided on the top surface of the insulator layer 20. Typically, each of the semiconductor fins 30 has a shape of a rectangular parallelepiped, i.e., a parallelepiped having six rectangular surfaces. Non-substantial variations from the shape of the rectangular parallelepiped, either in the shape of the faces or angles for the rectangular parallelepiped are included within the scope of the present invention. Alternative terms for the rectangular parallelepiped include a cuboid, a rectangular box, and a right rectangular prism.

Each of the semiconductor fins 30 comprises a first semiconductor material having a first lattice constant. The entirety of each of the semiconductor fins 30 is single crystalline, i.e., the first semiconductor material within the entirety of each of the semiconductor fins 30 forms a single crystal structure with epitaxial alignment. The first semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary case, the first semiconductor material is silicon.

The semiconductor fins 30 may be formed in any geometrical arrangement. In a non-limiting exemplary case, a plurality of semiconductor fins 30 may be formed in parallel with a substantially constant separation distance between neighboring pairs of semiconductor fins. While the present invention is described with a plurality of semiconductor fins 30 arranged in parallel alignment, arbitrary placement of the semiconductor fins is explicitly contemplated herein.

Typically, the semiconductor fins 30 are doped with electrical dopants of a first conductivity type. The electrical dopants may be at least one of p-type dopants such as B, Ga, and In. Alternately, the electrical dopants may be at least one of n-type dopants such as P, As, and Sb. The type of doping of the semiconductor fins 30 is herein referred to as a first conductivity type doping, which may be a p-type doping or an n-type doping. The atomic concentration of the electrical dopants in the semiconductor fins 30 may be from about $1.0 \times 10^{15}/cm^3$ to about $1.0 \times 10^{19}/cm^3$, and typically from about $1.0 \times 10^{16}/cm^3$ to about $1.0 \times 10^{18}/cm^3$, although lesser and greater concentrations are contemplated herein also Non-electrical stress-generating dopants such as Ge and/or C may also be present in the semiconductor fins 30.

While the present invention is described with semiconductor fins having a doping of the first conductivity type, the present invention may be practiced with additional semiconductor fins having a doping of the second conductivity type, which is the opposite type of the first conductivity type. For example, the first conductivity type may be p-type and the second conductivity type may be n-type, and vice versa. In this case, separate processing steps may be employed for a first group of semiconductor fins 30 having a doping of the first conductivity type and a second group of semiconductor fins (not shown) having a doping of the second conductivity type employing block level masks, which may be hard masks or soft masks.

Each of the semiconductor fins 30 have a first height h1. The first height h1 may be from about 10 nm to about 200 nm, and typically from about 40 nm to about 120 nm, although greater and lesser thicknesses are also contemplated herein. The width of the semiconductor fins 30 may vary from fin to fin. While the present invention is described with a set of semiconductor fins 30 having the same width, which is herein referred to as a first width w1, the present invention may be practiced with semiconductor fins having different widths. Such variations are explicitly contemplated herein.

The width of a semiconductor fin refers to the lesser dimension of the two lateral dimensions of the sides of the semiconductor fin as seen from above. The direction of the greater dimension of the two lateral dimensions of the sides of the semiconductor fin is herein referred to as a lengthwise direction, or a longitudinal direction. The direction along which the width of the semiconductor fin is measured is herein referred to as a widthwise direction. Thus, a length of a semiconductor fin is greater than the width of the semiconductor fin.

The first width w1 may be from about 10 nm to about 150 nm, and typically from about 20 nm to about 75 nm, although lesser and greater first widths are also contemplated herein. The length of a semiconductor fin 30 may be from about 50 nm to about 2,000 nm, and typically from about 100 nm to about 500 nm, although lesser and greater lengths are also contemplated herein.

In one embodiment, the semiconductor fins 30 may be formed by patterning a single crystalline top semiconductor layer of a semiconductor-on-insulator (SOI) substrate, of which the insulator layer 20 is a buried insulator layer.

A gate dielectric layer 40L is formed on the exposed surfaces of each of the semiconductor fin 30 including a top surface and sidewalls of the semiconductor fin 30. Each semiconductor fin 30 is encapsulated by one of the gate dielectric layers 40L and the insulator layer 20 encapsulate. The gate dielectric layers 40L covers the entirety of the top surfaces of the semiconductor fins 30. Each gate dielectric layer 40L is of unitary construction, i.e., the entirety of each of the gate dielectric layer 40L is contiguous.

In one case, each gate dielectric layer 40L comprises a dielectric material formed by thermal conversion of a portion of the semiconductor fin, such as silicon oxide or silicon nitride. Thermal oxidation, thermal nitridation, plasma oxidation, plasma nitridation, or a combination thereof may be employed to form the gate dielectric layer. In this case, the gate dielectric layers 40L are formed only on the sidewalls and top surfaces of the semiconductor fin 30. The thickness of the gate dielectric layers 40L may be from about 0.8 nm to about 10 nm, and typically from about 1.1 nm to about 6 nm.

In another case, the gate dielectric layers 40L may comprise a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited. In this case, the gate dielectric layers 40L comprise a single contiguous gate dielectric layer covering the entirety of the top surfaces and sidewall surfaces of the semiconductor fins 30 and the top surfaces of the insulator layer 20. In this case, the thickness of each gate dielectric layer 50L may be from about 1 nm to about 6 nm, and may have an effective oxide thickness on the order of or less than 1 nm.

Referring to FIGS. 2A-2D, a gate electrode layer and a gate cap dielectric layer are deposited over the surfaces of the gate dielectric layer 40L and the insulator layer 20, and are lithographically patterned to form a gate electrode 42 and a gate cap dielectric 48 over a middle portion of each of the semiconductor fins 30. Specifically, a photoresist (not shown) is applied over the stack of the gate electrode layer and the gate cap layer and lithographically patterned so that a portion of the photoresist straddles the middle portion of each of the semiconductor fins 30. The pattern in the photoresist is transferred into the gate cap dielectric layer and the gate electrode layer by an anisotropic etch such as a reactive ion etch. The remaining portion of the gate cap dielectric layer constitutes the gate cap dielectric 48, and the remaining portion of the gate electrode layer constitutes the gate electrode 42.

In one embodiment, the gate electrode 42 comprises an amorphous or polycrystalline semiconductor material such as polysilicon, amorphous silicon, a silicon-germanium alloy, a silicon-carbon alloy, a silicon-germanium-carbon alloy, or a combination thereof. The height of the electrode 42, as measured from the top surfaces of the gate dielectric layers 40L above the semiconductor fins 30, may be from about 30 nm to about 300 nm, and typically from about 60 nm to about 150 nm, although lesser and greater thicknesses are also contemplated herein. The gate electrode 42 may be in-situ doped, or may be doped by a subsequent ion implantation of dopants. Multiple gate electrodes 42 that are disjoined from one another may be formed over multiple semiconductor fins 30. In case semiconductor fins 30 having different types of doping are employed, the gate electrodes 42 may be doped differently by masked ion implantation to optimize performance of devices.

In another embodiment, the gate electrode 42 comprises a metal gate material, which comprises a metallic conductive material. For example, the gate electrode 42 may comprise a material such as TaN, TiN, WN, TiAlN, TaCN, other conductive refractory metal nitride, or an alloy thereof. The metal gate material may be formed by chemical vapor deposition (CVD), physical vapor deposition (PVD), atomic layer deposition (ALD), etc. and comprising a conductive refractory metal nitride. The thickness of the metal gate material may be from about 5 nm to about 40 nm, and preferably from about 10 nm to about 30 nm. In case the gate dielectric layers 40L comprise a high-k gate dielectric material, the metal gate material may be formed directly on the gate dielectric layers 40L. The composition of the metal gate material may be selected to optimize threshold voltages of semiconductor devices to be subsequently formed in the second device region 200. The gate electrode 42 may include both a metal gate material and a semiconductor material.

The gate cap dielectric 48 comprises a dielectric material such as silicon nitride and/or silicon oxide. For example, the gate cap dielectric 48 may comprise silicon nitride. The thickness of the gate cap dielectric 48 may be from about 15 nm to about 200 nm, and typically from about 50 nm to about 150 nm, although lesser and greater thicknesses are also contemplated herein.

The width of the gate electrode 42 and the gate cap dielectric 48, which is measured in the lengthwise direction of the semiconductor fins 30, i.e., in the horizontal direction in the plane C-C', may be substantially the same as the gate length of the fin field effect transistor, and may be the lithographic minimum length that is limited by the capabilities of a lithographic tool employed to pattern the gate electrode 42.

Source and drain extension ion implantation and/or halo ion implantation may be performed at this point to form source and drain extension regions (not shown) and halo regions (not shown) to enhance device performance of the field effect transistor.

Referring to FIGS. 3A-3D, exposed portions of the gate dielectric layers 40L are removed by an etch, which may be an isotropic etch such as a wet etch or a chemical downstream etch (CDE). The remaining portion from each of the gate dielectric layers constitutes a gate dielectric 40. Each gate dielectric separates a semiconductor fin 30 from the gate electrode 42.

A gate spacer 50 is formed on the sidewalls of the gate electrode 42 by deposition of a dielectric layer and an anisotropic etch, which removes horizontal portions of the dielectric layer. The dielectric layer may be formed, for example, by chemical vapor deposition (CVD) of a dielectric material. The remaining vertical portion of the dielectric layer constitutes the gate spacer 50. In general, the gate spacer 50 may laterally surround each gate electrode 42 if multiple gate electrodes 42 are present in a semiconductor structure.

Non-limiting exemplary dielectric materials the may be used for the gate spacer 50 include silicon oxide, silicon nitride, and silicon oxynitride. The thickness of the gate spacer 50, as measured at the base of the gate spacer 50, may be from about 5 nm to about 100 nm, and typically from about 10 nm to about 50 nm, although lesser and greater thicknesses are also contemplated herein.

Optionally, the order of the formation of the gate dielectric 40 and the formation of the gate spacer 50 may be reversed. In this case, the edges of the gate dielectrics 40 may be substantially vertically coincident with outer edges of the gate spacer 50. Such variations are explicitly contemplated herein.

Preferably, the thickness of the gate cap dielectric 48 is greater than the first height h1. In this case, the entirety of the sidewalls of the semiconductor fins 30 may be exposed without exposing any portion of the sidewalls of the gate electrode 42 by adjusting the duration of the anisotropic etch employed to form the gate spacer 50. In other words, the duration of the anisotropic etch may be set so that all portions of the dielectric layer is removed from the sidewalls of the semiconductor fins 30, but the remaining portion of the dielectric layer, which constitutes the gate spacer 50, covers the entirety of the sidewalls of the gate electrode.

A first end portion of each semiconductor fin 30 is exposed on one side of the stack of the gate electrode 42 and the gate cap dielectric 48, and a second portion of the semiconductor fin 30 is exposed on the other side of the side of the stack of the gate electrode 42. The side of a semiconductor fin 30 that contains the first end portion, i.e., a first exposed portion of the semiconductor fin 30, is herein referred to as a source-side, and the side of the semiconductor fin 30 that contains the second end portion, i.e., a second exposed portion of the semiconductor fin 30, is herein referred to as a drain-side. The top surfaces and the sidewalls of the first and second end portions is the only exposed semiconductor surface at this stage.

Referring to FIGS. 4A-4D, each of the first end portions and the second end portions of the semiconductor fins is etched by an etch, which contains at least some isotropic etch component. Preferably, the etch is an isotropic etch that removes the first semiconductor material of the semiconductor fin 30 (See FIGS. 3A-3D) at the same rate irrespective of the orientation of the exposed surfaces of the semiconductor fins 30. In other words, the removal rate of the first semiconductor material may be the same on the top surfaces of the first and second end portions as on the sidewall surfaces of the first and second end portions. Preferably, the etch is selective to the gate spacer 50, so that the material of the gate spacer 50 is preserved throughout the etch.

The portion of each semiconductor fin 30 that is laterally surrounded by one of the gate dielectrics 40, the gate electrode 42, and the gate spacer 50 is herein referred to as a center portion, of which the dimensions remain the same except for insignificant undercut during the etch. The dimensions of each center portion, which is laterally abutted by a first end portion and a second end portion, remain unchanged throughout the etch. Thus, the height of the center portion remains at the first height h1, and the width of the center portion remains at the first width w1. The height of the first and second end portions is reduced by the etch to a second height h2, and the width of the first and second end portions are reduced by the etch to a second width w2. Thus, the sidewalls of the first and second end portions of the semiconductor fins 30 are laterally recessed, and the top surfaces of the first and second end portions of the semiconductor fins are vertically recessed.

In case the etch is isotropic, the decrease in the width of the first and second end portions is twice the decrease in the height of the first and second end portions, i.e., $w1-w2=2\times(h1-h2)$. Otherwise, the decrease in the width of the first and second end portions may be less than the decrease in the height of the first and second end portions, i.e., $w1-w2<2\times(h1-h2)$ since the anisotropic component in the etch may increase the removal rate of the first semiconductor material from the top surfaces of the first and second end portions above the removal rate of the first semiconductor material from the sidewall surfaces of the first and second end portions.

In one embodiment, exposed surfaces of the insulator layer 20 are recessed by a recess depth rd by an etch, which may be combined with the etch that recesses the top surfaces and sidewall surfaces of the first and second end portions or may be a separate etch. In case a separate etch is employed to recess the exposed surfaces of the insulator layer 20, the recessing of the exposed surfaces of the insulator layer 20 may be performed prior to, or after, the recessing of the surfaces of the first and second end portions of the semiconductor fins 30.

Preferably, the recessing of the exposed surfaces of the insulator layer 20 is performed anisotropically so that the bottom surfaces of the semiconductor fins 30 are not undercut in any significant manner. By preventing undercut, the semiconductor fins 30 are structurally supported by the underlying insulator layer 20 without potential breakage. In case the exposed surfaces of the insulator layer 20 are recessed after lateral recessing of the sidewalls of the first and second end portions of the semiconductor fins 30, the steps in the insulator layer 20 between the recessed portion and bottom surfaces of the semiconductor fins 30 may be substantially vertically coincident with the sidewalls of the first and second end portions of the semiconductor fins 30, which have the second width w2.

The recess depth rd may be from about 10 nm to about 200 nm, and typically from about 20 nm to about 100 nm, although lesser and greater recess depths are also contemplated herein. The recessing of the exposed surfaces of the insulator layer 20 increases the volume in which portions of a second single crystalline semiconductor material may be subsequently deposited, which increases the magnitude of longitudinal stress, and consequential transverse stress, applied by the portions of the second single crystalline semiconductor material to the center portion of the semiconductor fins 30, each of which includes a body region of the fin field effect transistor.

Source and drain ion implantations are performed to form a source region 34 and a drain region 36 in each semiconductor fin 30. Specifically, dopants of the second conductivity type, which is the opposite of the first conductivity, are implanted into the semiconductor fins 30 employing the stack of the gate electrode 42 and the gate cap dielectric 48 and the gate spacer 50 as a self-aligning ion implantation mask. The unimplanted portions of the semiconductor fins 30 constitute body regions 32, which has a doping of the first conductivity type. The boundary between a source region 34 and an adjoined body region 32 is formed self-aligned to an outer edge of the gate spacer 50 with an offset, which may be optimized by controlling an implantation angle during the source and drain ion implantations. Likewise, the boundary between a drain region 36 and an adjoined body region 32 is formed self-aligned to another outer edge of the gate spacer 50 with an offset, which may be optimized by controlling an implantation angle during the source and drain ion implantations.

The boundaries between each body region 32 and the adjoining source region 34 and the adjoining drain region 36 constitute p-n junctions. The body regions 32 constitute channels of the fin field effect transistor. Typically, the p-n junctions are formed within the center portions, i.e., the portion of the semiconductor fins 30 having the first width w1 and the first height h1. The p-n junction between the source region 34 and the body region 32 is herein referred to as a source-side p-n junction, and the p-n junction between the drain region 36 and the body region 32 is herein referred to as a drain-side p-n junction. The p-n junctions are directly adjoined to peripheral portions of the gate dielectrics 40.

Referring to FIGS. 5A-5E, a second semiconductor material is epitaxially deposited on the exposed semiconductor surfaces, which include the top surfaces and sidewall surfaces of the first and second end portions of each of the semiconductor fins 30. A source-side epitaxial semiconductor region 64 comprising a second single crystalline semiconductor material is formed on each first end portion of the semiconductor fins 30, and a drain-side epitaxial semiconductor region 66 comprising the second single crystalline semiconductor material is formed on each second end portion of the semiconductor fins 30.

Each source-side epitaxial semiconductor region 64 abuts, and is epitaxially aligned to, a first end portion of a semiconductor fin 30. Each drain-side epitaxial semiconductor region 66 abuts, and is epitaxially aligned to, a second end portion of a semiconductor fin 30. The entirety of each semiconductor fin 30 and the source-side and drain-side epitaxial semiconductor regions (64, 66) adjoined to the semiconductor fin is single crystalline with epitaxial alignment therein.

The second semiconductor material has a second lattice constant, which is different from the first lattice constant. The differences in the lattice constants of the first and second semiconductor materials induce longitudinal and transverse stress in each of the semiconductor fins 30. The length of each semiconductor fin 30 is greater than the second width w2 of the semiconductor fin 30, so that the longitudinal stress along the lengthwise direction, or the longitudinal direction, is greater than the transverse stress along the transverse direction, or the widthwise direction of the semiconductor fin 30. The widthwise direction is the direction along which the second width w2 is measured.

Preferably, selective epitaxy is employed to deposit the second semiconductor material on semiconductor surfaces, while preventing nucleation of the second semiconductor material directly on dielectric surfaces that include the surfaces of the gate cap dielectric 48, the gate spacer 50, and the exposed top surfaces of the insulator layer 20. The selective epitaxy is typically effected by flowing a reactant gas and an etchant gas simultaneously or alternatively in a reactor. Thus, the second semiconductor material grows from the exposed surfaces of the source region 34 and the drain regions 36.

While nucleation on dielectric surfaces is prevented in the selective epitaxy on the dielectric surfaces, the source-side and drain-side epitaxial semiconductor regions (64, 66) may grow laterally across the dielectric surfaces. Thus, the source-side and drain-side epitaxial semiconductor regions (64, 66) may grow downward along the steps in the top surfaces of the insulator layer 20 and then laterally along the recessed surfaces of the insulator layer. Upon continued deposition, the recessed portions of the insulator layer 20 may be completely filled between a pair of adjacent semiconductor fins 30 by a pair of source-side epitaxial semiconductor regions 64 or by a pair of drain-side epitaxial semiconductor regions 66. Thus, the recessed surfaces of the insulator layer may abut the source-side epitaxial semiconductor regions 64 or the drain-side epitaxial semiconductor regions 66. Likewise, the source-side and drain-side epitaxial semiconductor regions (64, 66) may grow upward along the outer surfaces of the gate spacer 50, thereby abutting lower portions of the gate spacer 50.

In case the semiconductor fins 30 comprise a plurality of semiconductor fins 30, the source-side epitaxial semiconductor regions 64 may laterally abut one another if the thickness of the deposited second semiconductor material exceeds half the separation distance between a neighboring pair of first end portions. Similarly, the drain-side epitaxial semiconductor regions 66 may laterally abut one another if the thickness of the deposited second semiconductor material exceeds half the separation distance between a neighboring pair of second end portions. The boundaries at which the source-side epitaxial semiconductor regions 64 abut one another are shown in dotted lines in FIG. 5A. Also, the boundaries at which the drain-side epitaxial semiconductor regions 66 abut one another are shown in dotted lines in FIG. 5A.

The vertical thickness of the second semiconductor material, i.e., the vertical thickness of the source-side and drain-side epitaxial semiconductor regions (64, 66) as measured on the top surface of the source region 34 or the drain region 36, may be from about 10 nm to about 200 nm, and typically from about 20 nm to about 100 nm, although lesser and greater vertical thicknesses are also contemplated herein. In case the semiconductor fins 30 is a plurality of substantially parallel semiconductor fins 30 having a constant spacing, the vertical thickness may exceed half the spacing between adjacent pairs of semiconductor fins 30 so that multiple source-side 64 are laterally abutted, and multiple drain-side epitaxial semiconductor regions 66 are laterally abutted.

Each semiconductor fin 30 is encapsulated by the insulator layer 20, a source-side epitaxial semiconductor region 64, a drain-side epitaxial semiconductor region 6, a gate dielectric 40, and a gate spacer 50. Each source region 34 includes the entirety of the first end portion and a peripheral sub-portion of the center portion of a semiconductor fin 30. Each drain region 36 includes the entirety of the second end portion and another peripheral sub-portion of the center portion of a semiconductor fin 30. The center portion of a semiconductor fin 30 includes the entirety of the body region 32 of the semiconductor fin and a peripheral portion of the source region 34, which is a peripheral sub-portion of the center portion, and another peripheral portion of the drain region 36, which is another peripheral sub-portion of the center portion. The gate spacer 50 separates the gate electrode 42 from the source-side and drain-side epitaxial semiconductor regions (64, 66).

In one embodiment, the second lattice constant is greater than the first lattice constant, and each pair of source-side and drain-side epitaxial semiconductor regions (64, 66) applies a longitudinal compressive stress to the center portion of the semiconductor fin 30 that the pair of the source-side and drain-side epitaxial semiconductor regions (64, 66) abuts. Thus, the longitudinal compressive stress is applied to the body region 32 within the semiconductor fin 30, which is a channel of the fin field effect transistor. The longitudinal compressive stress may be advantageously employed to enhance the mobility of charge carriers in the channel of the fin field effect transistor, thereby enhancing the performance of the fin field effect transistor. In a non-limiting example, the first semiconductor material may be silicon and the second semiconductor material may be a silicon-germanium alloy. A p-type fin field effect transistor employing a silicon channel having a compressive longitudinal stress provides greater on-current than an unstrained equivalent.

In one embodiment, the second lattice constant is less than the first lattice constant, and each pair of source-side and drain-side epitaxial semiconductor regions (64, 66) applies a longitudinal tensile stress to the center portion of the semiconductor fin 30 that the pair of the source-side and drain-side epitaxial semiconductor regions (64, 66) abuts. Thus, the longitudinal tensile stress is applied to the body region 32 within the semiconductor fin 30, which is a channel of the fin field effect transistor. The longitudinal tensile stress may be advantageously employed to enhance the mobility of charge carriers in the channel of the fin field effect transistor, thereby enhancing the performance of the fin field effect transistor. In a non-limiting example, the first semiconductor material may be silicon and the second semiconductor material may be a silicon-carbon alloy. An n-type fin field effect transistor employing a silicon channel having a tensile longitudinal stress provides greater on-current than an unstrained equivalent.

The first semiconductor material and the second semiconductor material exchange stress at their interfaces. Thus, if the first semiconductor material applies a tensile stress to the second semiconductor material, the second semiconductor material applies a compressive stress to the first semiconductor material, and vice versa. The more the amount of the second semiconductor material relative to the amount of the first semiconductor material, the greater the magnitude of the stress that the second semiconductor material applies to the first semiconductor material. In general, thus, it is advantageous to provide more second semiconductor material to generate greater stress in the center portion, which includes the body region 32, of a semiconductor fin 30.

In an embodiment of the present invention, the amount of second semiconductor material that may be deposited to exert stress on the first semiconductor material in the semiconductor fins 30 is increased by laterally recessing the first and second end portions so that the width decreases from the first width w1 to the second width w2. In other words, the lateral recessing of the first and second end portions of each semiconductor fin 30 provides more volume on which the second semiconductor material may be deposited. Further, the amount of the first semiconductor material in the semiconductor fins 30 is reduced by the reduction in the volume of the first and second end portions that reduce the width and the height of the first and second end portion.

Further, the recessing of the top surfaces of the exposed surfaces of the insulator layer 20 to the recess depth rd increases the volume in which the second semiconductor material may be deposited. The source-side and drain-side epitaxial semiconductor regions (64, 66) abut the top surfaces and sidewalls of the recessed portions of the insulator layer 20. Since the second semiconductor material filling the recessed regions of the insulator layer 20 is located beneath the bottom surfaces of the semiconductor fins 30, the second semiconductor material in the source-side and drain-side epitaxial semiconductor regions (64, 66) effectively delivers the longitudinal stress even to the bottom portions of the body regions 32 in the semiconductor fins 30.

The geometry of an embodiment of the present invention allows formation of a substantial quantity of the second single crystalline semiconductor material at the height of the semiconductor fins 30 and below the bottom surfaces of the semiconductor fins 30, thereby increasing the magnitude of the longitudinal stress applied to the center portions, having the first height h1 and the first width w1, which includes the body regions 32 of the semiconductor fins 30. In addition, the first end portions and the second end portions of the semiconductor fins 30 have reduced widthwise cross-sectional dimensions, i.e., the second width w2 and the second height h2, in comparison with widthwise cross-sectional dimensions of the center portions, i.e., the first width w1 and the first height h1.

As an example illustrating of the feasibility of the present invention, a fin field effect transistor that employs silicon as the first semiconductor material and a silicon germanium alloy has been constructed, which showed 0.4% of longitudinal compressive strain and 800 MPa of longitudinal compressive stress in the body region of a p-type fin field effect transistor, and accompanying enhancement in the mobility and on-current of the p-type fin field effect transistor.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a semiconductor fin comprising a first single crystalline semiconductor material having a first lattice constant and including a body region having a doping of a first conductivity type and a source region and a drain region having a doping of a second conductivity type, wherein said second conductivity type is the opposite of said first conductivity type;
    a source-side epitaxial semiconductor region comprising a second single crystalline semiconductor material having a second lattice constant and epitaxially aligned to said source region, wherein said second lattice constant is different from said first lattice constant; and
    a drain-side epitaxial semiconductor region comprising said second single crystalline semiconductor material having said second lattice constant and epitaxially aligned to said drain region.

2. The semiconductor structure of claim 1, wherein said semiconductor fin comprises a center portion having a first width and a first end portion and a second end portion laterally abutting said center portion and having a second width, wherein said first width is greater than said second width.

3. The semiconductor structure of claim 2, wherein a boundary between said body region and said source region is located within said center portion, and wherein a boundary between said body region and said drain region is located within said center portion.

4. The semiconductor structure of claim 2, further comprising:
    a gate dielectric located on a pair of sidewalls and a top surface of said center portion; and
    a gate electrode located on said gate dielectric.

5. The semiconductor structure of claim 4, further comprising a gate spacer and comprising a dielectric material, wherein outer sidewalls of said gate spacer are substantially vertically coincident with a boundary between said center portion and said first end portion or a boundary between said center portion and said second end portion.

6. The semiconductor structure of claim 1, further comprising an insulator layer abutting an entirety of a bottom surface of said semiconductor fin, wherein said semiconductor fin is encapsulated by said insulator layer, said source-side epitaxial semiconductor region, said drain-side epitaxial semiconductor region, said gate dielectric, and said gate spacer.

7. The semiconductor structure of claim 2, wherein said source-side epitaxial semiconductor region abuts an entirety of a top surface and sidewall surfaces of said first end portion, and wherein said drain-side epitaxial semiconductor region abuts an entirety of a top surface and sidewalls of said second end portion.

8. The semiconductor structure of claim 1, wherein said semiconductor fin comprises a center portion having a first height and a first end portion and a second end portion laterally abutting said center portion and having a second height, wherein said first height is greater than said second height.

9. The semiconductor structure of claim 8, further comprising:
    a gate dielectric located on a pair of sidewalls and a top surface of said center portion; and
    a gate electrode located on said gate dielectric.

10. The semiconductor structure of claim 9, further comprising a gate spacer and comprising a dielectric material, wherein outer sidewalls of said gate spacer are substantially vertically coincident with a boundary between said center portion and said first end portion or a boundary between said center portion and said second end portion.

11. The semiconductor structure of claim 1, further comprising an insulator layer having a first surface abutting an entirety of a bottom surface of said semiconductor fin, a second surface located below said first surface by a recess depth and abuts said source-side epitaxial semiconductor region, and a third surface located below said first surface by said recess depth and abuts said drain-side epitaxial semiconductor region.

12. The semiconductor structure of claim 1, wherein said second lattice constant is greater than said first lattice constant, and wherein said source-side epitaxial semiconductor region and said drain-side epitaxial semiconductor region apply a longitudinal compressive stress to said body region.

13. The semiconductor structure of claim 1, wherein said second lattice constant is less than said first lattice constant, and wherein said source-side epitaxial semiconductor region and said drain-side epitaxial semiconductor region apply a longitudinal tensile stress to said body region.

14. A semiconductor structure comprising:
    a plurality of semiconductor fins, each comprising a first single crystalline semiconductor material having a first lattice constant and including a body region having a doping of a first conductivity type and a source region and a drain region having a doping of a second conductivity type, wherein said second conductivity type is the opposite of said first conductivity type;
    a plurality of laterally abutting source-side epitaxial semiconductor regions, each comprising a second single crystalline semiconductor material having a second lattice constant and epitaxially aligned to said source region, wherein said second lattice constant is different from said first lattice constant; and
    a plurality of laterally abutting drain-side epitaxial semiconductor regions, each comprising said second single crystalline semiconductor material having said second lattice constant and epitaxially aligned to said drain region.

* * * * *